(12) United States Patent
Bajkowski et al.

(10) Patent No.: US 7,499,342 B2
(45) Date of Patent: Mar. 3, 2009

(54) DYNAMIC MODULE OUTPUT DEVICE AND METHOD THEREOF

(75) Inventors: Maciej Bajkowski, Austin, TX (US); Ravindraraj Ramaraju, Round Rock, TX (US); Andrew Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 51 days.

(21) Appl. No.: 11/620,080

(22) Filed: Jan. 5, 2007

(65) Prior Publication Data

US 2008/0165590 A1 Jul. 10, 2008

(51) Int. Cl.
*G11C 7/10* (2006.01)
*G11C 7/06* (2006.01)

(52) U.S. Cl. ............................. 365/189.05; 365/189.02; 365/189.07; 365/189.08

(58) Field of Classification Search ............. 365/189.02, 365/189.05, 189.07, 189.08, 194
See application file for complete search history.

(56) References Cited

U.S. PATENT DOCUMENTS

| | | | | |
|---|---|---|---|---|
| 5,077,690 A * | 12/1991 | Smith | ........................ | 365/201 |
| 5,274,591 A * | 12/1993 | Waller et al. | ............ | 365/189.14 |
| 5,289,415 A | 2/1994 | DiMarco et al. | | |
| 5,487,038 A * | 1/1996 | Komarek et al. | ............. | 365/191 |
| 5,488,581 A * | 1/1996 | Nagao et al. | ........... | 365/189.05 |
| 5,877,988 A * | 3/1999 | Shim et al. | ............. | 365/189.15 |
| 5,973,988 A * | 10/1999 | Nakahira et al. | ......... | 365/49.17 |
| 6,160,742 A * | 12/2000 | Chung et al. | ........... | 365/189.05 |
| 6,307,767 B1 * | 10/2001 | Fuh | ......................... | 365/49.17 |
| 6,317,367 B1 * | 11/2001 | Sample et al. | ......... | 365/189.08 |
| 6,345,007 B1 * | 2/2002 | Kim | ...................... | 365/189.16 |
| 6,490,207 B2 * | 12/2002 | Manning | ..................... | 365/149 |
| 6,519,188 B2 * | 2/2003 | Ryoo et al. | ............ | 365/189.05 |
| 6,738,295 B2 * | 5/2004 | Kim | ...................... | 365/189.05 |
| 6,768,698 B2 * | 7/2004 | Kono | ...................... | 365/233.1 |
| 7,075,853 B2 * | 7/2006 | Jeong et al. | ............ | 365/189.15 |
| 7,142,469 B2 * | 11/2006 | Kim et al. | .................... | 365/194 |
| 2006/0022715 A1 | 2/2006 | Kawasumi | | |

* cited by examiner

*Primary Examiner*—Ly D Pham

(57) ABSTRACT

A dynamic module output device and methods thereof are disclosed. The dynamic module output device is connected to a dynamic module. The dynamic module output device provides the output of the dynamic module via two pathways. The first pathway is a direct output from the dynamic module. The second pathway includes a latch that stores the output of the dynamic module. The two output pathways are connected to a logic gate connected to downstream circuitry. Accordingly, data is provided to downstream circuitry rapidly via the first pathway, while being latched to allow the data to be available to the downstream circuitry after the evaluation phase. Such a parallel latching configuration provides enhanced efficiency in transfer and processing of information, especially in conjunction with utilization of precharge and evaluation phases.

20 Claims, 4 Drawing Sheets

DYNAMIC MODULE OUTPUT DEVICE AND METHOD THEREOF

FIELD OF THE DISCLOSURE

The present disclosure is related generally to data processing devices and more specifically to transferring data in data processing devices.

BACKGROUND

Latches are frequently used to store the output of dynamic modules, such as such as memory arrays. Data is provided to the latch during an evaluation phase of the dynamic module and the data is stored in the latch during the subsequent precharge phase of the module. However, the logic gates of the latch in the critical pathway can cause undesirable delays in the data transfer. Accordingly, an improved device and techniques for latching data would be advantageous.

DESCRIPTION OF THE EMBODIMENT(S)

A dynamic module output device and methods thereof are disclosed. The dynamic module output device is connected to a dynamic module. As used herein, a dynamic module refers to a module that incorporates two phases to provide output data. In a precharge phase, the dynamic module is readied to provide data. In an evaluation phase, the data is provided at an output of the dynamic module. The dynamic module output device provides the output of the dynamic module via two pathways. The first pathway is a direct output from the dynamic module. The second pathway includes a latch that stores the output of the dynamic module. The two output pathways are connected to a logic gate connected to downstream circuitry. Accordingly, data is provided to downstream circuitry rapidly via the first pathway, while being latched to allow the data to be available to the downstream circuitry after the evaluation phase. Such a parallel latching configuration provides enhanced efficiency in transfer and processing of information, especially in conjunction with utilization of precharge and evaluation phases.

Figure 1:
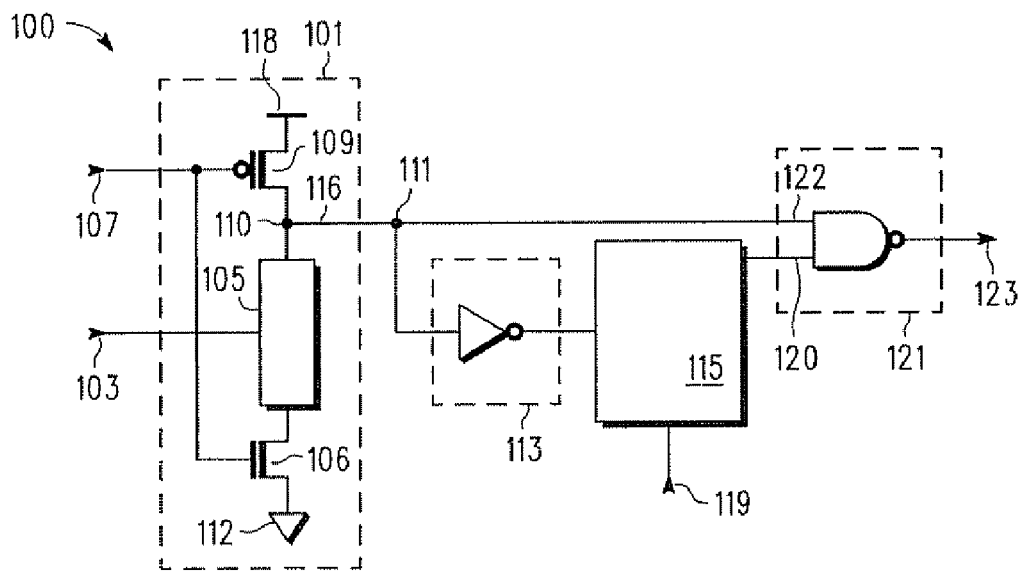
FIG. 1 is a block diagram illustrating a device having a parallel latching system in accordance with one embodiment of the present disclosure.

Referring to FIG. 1, a block diagram of a particular embodiment of a device 100 is illustrated. The device 100 includes a dynamic module 101, a dynamic node 111, an inverter 113, a NAND gate 121, and a latch 115. The dynamic module 101 includes a data input 103, a clock input 107, and an output 116. The dynamic node 111 is connected to the output 116. The inverter 113 includes an input connected to the dynamic node 111, and an output. The latch 115 includes an input connected to the output of the inverter 113, a clock input 119, and a data output. The NAND gate 121 includes a first input 122 connected to the dynamic node 111, a second input 120 connected to the data output of the latch 115, and an output 123 connected to downstream circuitry (not shown).

In further reference to the dynamic module 101, the module includes a logic module 105 connected to a first transistor 109 and a second transistor 106. Accordingly, the first transistor 109 includes a first current-carrying electrode connected to a first voltage reference 108, a second current-carrying electrode connected to a first node 110, and a control electrode connected to the clock input 107 to receive a clock signal. As illustrated, the second transistor 106 includes a first current-carrying electrode connected to the logic module 105, a second current-carrying electrode connected to a ground 112, and a control electrode configured to receive a clock signal from clock input 107.

Figure 6:
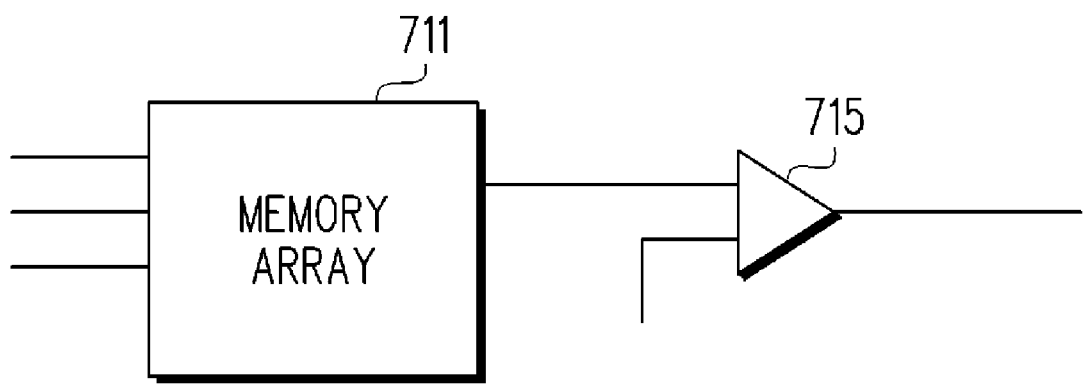

In one embodiment, the dynamic module 101 can include a memory storage module, such as a memory array (e.g. memory airy 711 of FIG. 6) having logic modules, and a sense amplifier (e.g. sense amplifier 715 of FIG. 6) connected between the memory array and the memory output. The memory storage module can store operation data and can include, for example, a cache, a buffer, an embedded random access memory (RAM), a read only memory (ROM), and the like. In another embodiment, the dynamic module 101 includes other dynamic modules such as, for example, an adder or a comparator.

During operation of the device 100, information (e.g. a bit or bits of information) is output from the dynamic module 101 through output 116 and eventually to output 123 to provide the information to downstream circuitry. For example, the dynamic module 101 may be a memory array and the downstream circuitry may be a processor. During a read process of the dynamic module 101, the module is precharged during a precharge phase which readies the module to provide the stored data information. During this precharge phase, the dynamic node 111 is placed in a logic high state, so that the output of the NAND gate 132 is dependent on the logic value at the output of the latch 115.

During the evaluation phase subsequent to the precharge phase, the dynamic node 111 is placed at a logic level based on the output 116 of the dynamic module 101. Accordingly, the output of the NAND gate 121 depends on the output 116 of the dynamic module 101. Thus, a representation of the data provided by the dynamic module 101 is provided to the downstream circuitry without any latching delays.

In addition, during the evaluation phase, the latch 115 receives the information from the output 116 of the dynamic module 101 along the second pathway. The latch 115 latches the output data and subsequently provides the data to the NAND gate 121. The data is held in the latch 115 until the next evaluation phase. Accordingly, when the dynamic module 101 enters the subsequent precharge phase, the latched data is still available to the downstream circuitry.

It will be appreciated that NAND gate 121 can be another type of logic module, including for example, an AND, OR, NOR or XOR gate. In reference to the inverter 113, according to another embodiment, the inverter 113 can be another type of logic module, including for example, an AND, OR, NOR or NAND gate. Additionally, the inverter 113 can be part of a keeper module. The NAND gate 121 and inverter 113 can be replaced with more complex logic modules or cascaded arrangements of logic gates. Latch 115 can be a dynamic latch, static latch, or other appropriate latch.

Figure 2:
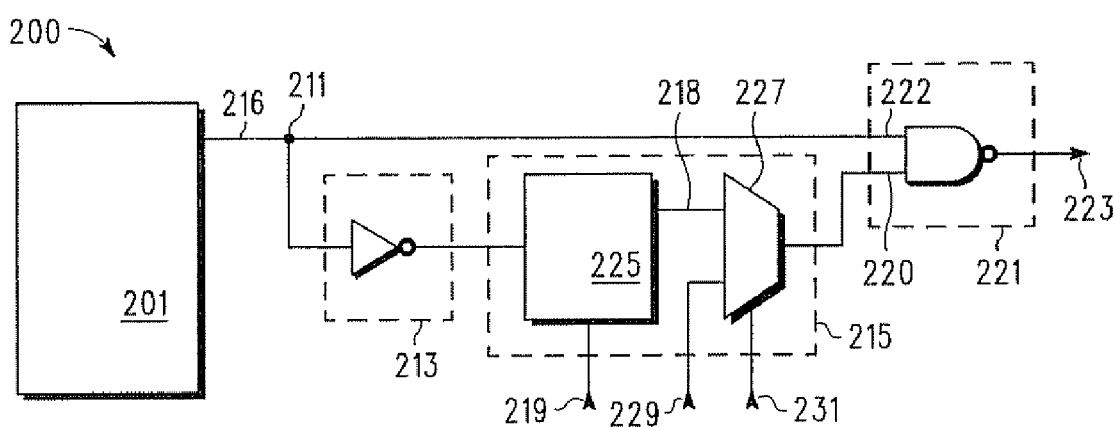
FIG. 2 is a block diagram illustrating a device having a parallel latching system in accordance with an alternative embodiment of the present disclosure.

Referring to FIG. 2, an exemplary embodiment of a device 200 is illustrated which includes a dynamic module 201, a dynamic node 211, an inverter 213, a latching system 215 including a dynamic latch 225 and a multiplexer 227, and a NAND gate 221. According to one embodiment, the dynamic module 201 has an output 216. The dynamic node 211 is connected to the output 216. The inverter 213 has an input connected to the dynamic node 211, and an output. The dynamic latch 225 has an input connected to the output of the inverter 213, a clock input 219, and a data output 218. The multiplexer 227 includes a data input connected to the data output 218 of the dynamic latch 225, a bypass data input 229, a bypass enable input 231, and an output. The NAND gate 221 has a first input 222 connected to the dynamic node 211, a second input 220 connected to the output of the multiplexer 227, and an output 223 connected to downstream circuitry.

During operation of the device 200, information is output from the dynamic module 201 through output 216 and eventually to output 223 to provide the information to downstream circuitry. In addition to the operations described above with respect to FIG. 1, the device 200 is capable of selecting information via the multiplexer 227. Information output from the dynamic latch 215 may be transferred through the multiplexer 227 to the NAND gate 221. Alternatively, the multiplexer 227 may select bypass data from the bypass data input 229 and provide such bypass data to the NAND gate 221. The selected input is controlled by a signal provided to the bypass enable input 231. According to one embodiment, the multiplexer 227 includes the bypass data input 229 and the bypass enable input 231, to enable selection of information from the dynamic latch 225 or an outside data source connected to the multiplexer 227 through the bypass data input 229. Accordingly, when the multiplexer 227 is used to select bypass data, the dynamic node 211 can be placed in the appropriate state, to assure that the bypass data is available at the output of the NAND gate 221. For example, when the bypass data is selected, a clock provided to the dynamic module 201 can be placed in the appropriate state so that the dynamic node is at a logic high state. Use of the multiplexer 227 between the dynamic latch 225 and the NAND gate 221 may be useful in testing applications. Other logic modules may be employed between the dynamic latch 225 and the NAND gate 221, including registers, adders, and the like.

Figure 3:
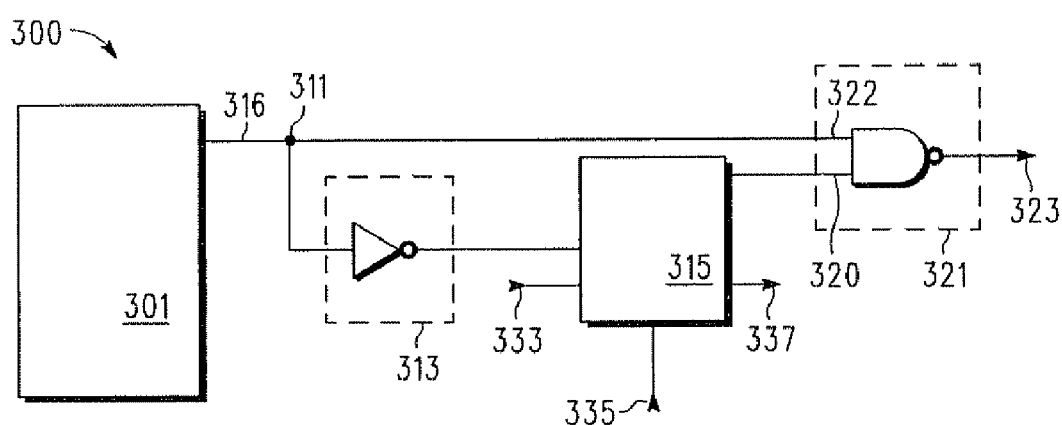
FIG. 3 is a block diagram illustrating a device having a parallel latching system in accordance with an alternative embodiment of the present disclosure.

Referring to FIG. 3, another exemplary embodiment of a device 300 is illustrated, which includes a dynamic module 301, an inverter 313, a scan latch 315, and a NAND gate 321. The dynamic module 301 has an output 316 connected to a dynamic node 311. The inverter 313 has an input connected to the dynamic node 311, and an output. The scan latch 315 has a data input 333 connected to the output of the inverter 313, a scan data input 333, a clock input 335, and an output. The NAND gate 321 includes a first input 322 connected to the dynamic node 311, a second input 320 connected to the output of the scan latch 315, and an output connected to downstream circuitry.

During operation of the device 300, information is output from the dynamic module 301 through output 316 and eventually to output 323 to provide the information to downstream circuitry. In addition to operations described above with respect to FIG. 1, device 300 is capable of integrating information from outside sources provided to the scan latch 315 via the scan input 333. If the scan latch 315 receives information from the scan input 333, information stored in the scan latch 315 is scanned and relayed to the scan output 337, and thereby provided to downstream circuitry. In particular reference to the scan latch 315, such a latch includes integrated logic, capable of performing a scan function in addition to a latching function. Use of the scan latch 315 may be useful in testing applications. It will be appreciated that latches with additional or other integrated logic can be used, including latches having registers, adders, multiplexers and the like.

Figure 4:
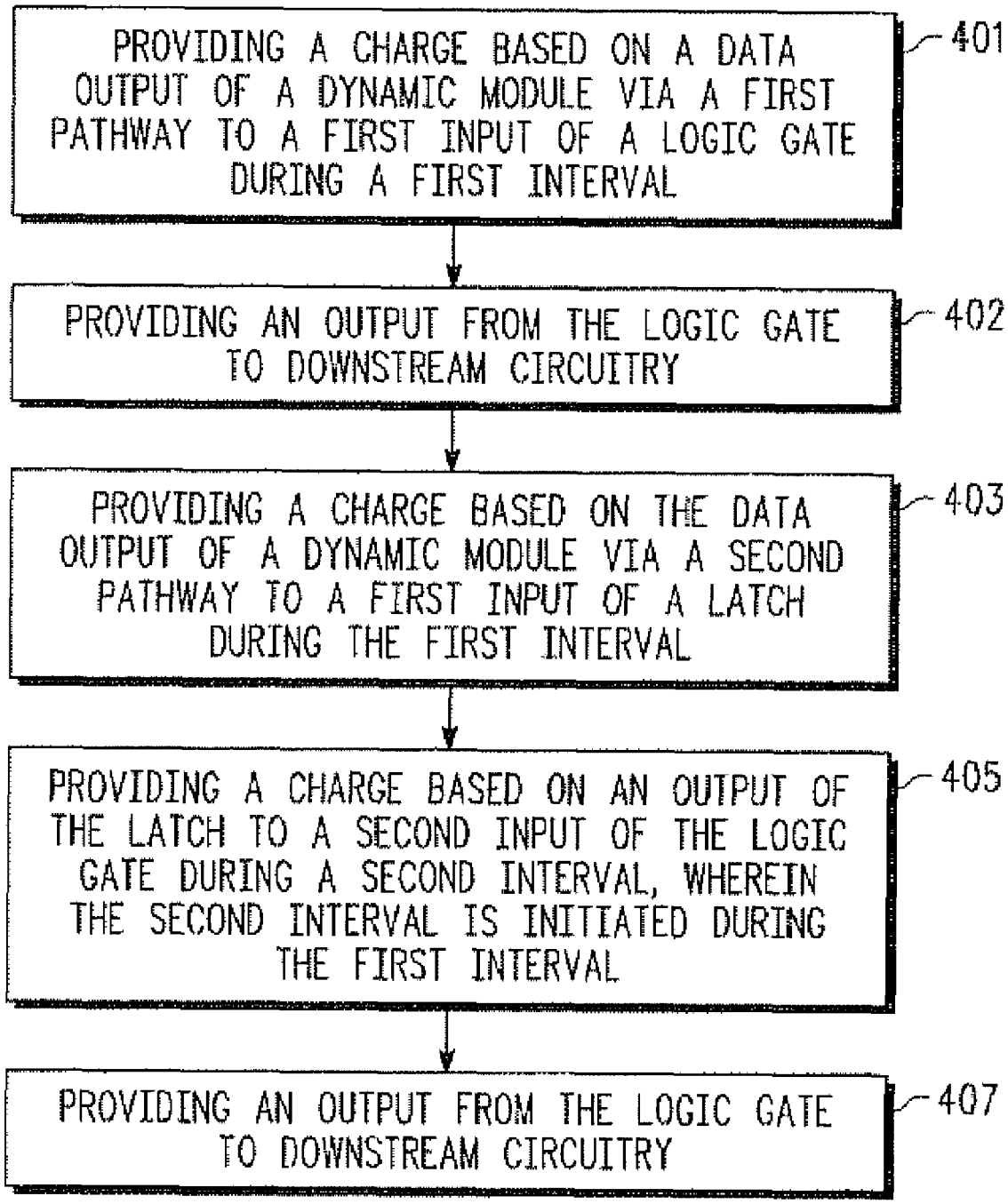
FIG. 4 is a flow chart illustrating a method of providing data from a dynamic module latching system in accordance with an alternative embodiment of the present disclosure.

Referring now to FIG. 4, a particular embodiment of a method for providing data from a dynamic module is illustrated. At block 401, a charge based on a data output of a dynamic module is provided via a first pathway to a first input of a logic gate during a first interval. The dynamic module can include a memory storage module, such as a memory array, an adder, a comparator, and the like. At block 402, a charge is provided from the logic gate to downstream circuitry. Accordingly, a charge based on the output of the dynamic module is rapidly provided to downstream circuitry without delays associated with latching the charge.

Moving to block 403, a charge based on the data output of the dynamic module is provided via a second pathway to a first input of a latch during the first interval. Particularly, the same charge value that was provided along the first pathway is provided in a parallel configuration along the second pathway. A logic operation can be performed on the charge prior to providing the charge to the input of the latch. In one particular embodiment, performing such a logic operation includes providing the charge to an inverter, performing an inverting operation on the charge within a keeper module.

The logic operation on the charge can also be performed using integrated logic within the latch device. As described in embodiments herein, performing integrated logic operations can include functions such as, for example, a multiplexing function, a bypass function, or a scanning function. According to another embodiment, performing a logic function from a logic device integrated within the latch includes providing information to the latch from a second module during the first interval. Charges from a second module can include information, such as bypass data.

Proceeding to block 405, a charge is provided from an output of the latch to a second input of the logic gate during a second interval. A logic function can be performed on the charge from the output of the latch at an additional logic module before the output is provided to the second input of the logic gate. For example, the output of the latch may be provided to an input of a register, an adder, multiplexer, or the like. Such logic components can be connected to the logic gate and provide an output to the second input of the logic gate. Also, such logic components can include additional inputs for receiving information from other sources, and additional outputs for providing information to downstream circuitry. Generally, the second interval is initiated after the start of the first interval and particularly is initiated during the first interval.

Moving to block 407, a charge is provided from the logic gate to downstream circuitry. In particular, the charge provided from the output of the latch to the second input of the logic gate undergoes a NAND operation, and subsequently an output is generated at the logic gate. As described above, the logic gate in one embodiment, is a NAND gate, however, other simple or complex logic components can be utilized.

Figure 5:
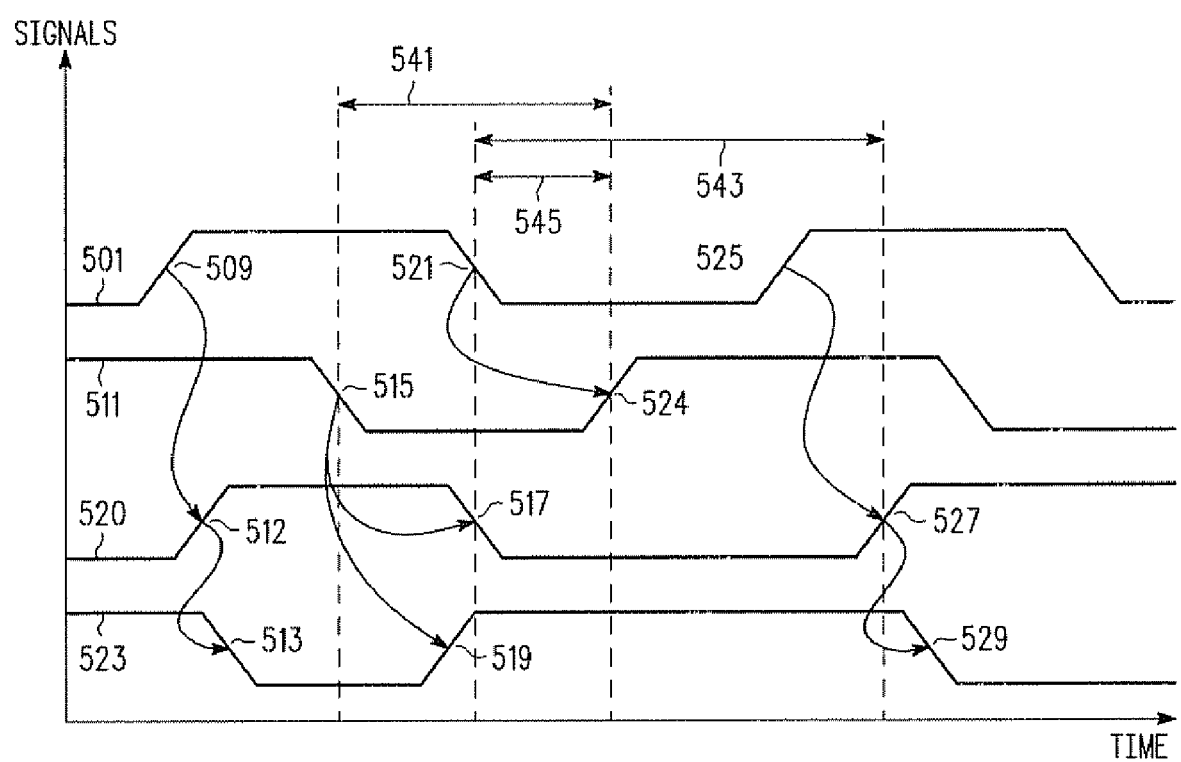
FIG. 5 is a timing diagram for providing data from a dynamic module in accordance with at least one embodiment of the present disclosure and FIG. 6 is a block diagram of a particular embodiment of the dynamic module of FIG. 1.

In reference to FIG. 5, a timing diagram is provided which illustrates signals for devices within a parallel latching system according to one particular embodiment. Accordingly, FIG. 5 illustrates a clock signal 501, a dynamic node signal 511, a latch output signal 520, and an output signal 523. Each of the signals represents a charge value. Additionally, the signals illustrated in FIG. 5 are described as having a "high state" or "low state" for ease of description, however, it will be appreciated that such terms are descriptive of a relative change in the state and are not intended to define any particular or absolute state or charge value associated with the device.

As illustrated, the timing diagram provides a first interval 541, a second interval, 543, and a third interval 545. The first interval 541 as provided in this particular embodiment, represents the duration, initiated during the evaluation phase when the data is provided to the data output via a first pathway. The second interval 543 is initiated during an evaluation state, and represents the duration for which the latch output signal 520 has changed states. The third interval 545 is the duration from the beginning of the second interval 543 to the end of the first interval 541, and particularly represents a hold time. As will be appreciated, the third interval 545 or the hold time is the duration from the time at which the data is processed by the latch and held within the logic of the latch to the time at which the dynamic node signal 511 returns to a precharge state at 524. The hold time is the minimum amount of time the dynamic node needs to be held at the evaluated value in order for the data to be latched. Accordingly, in this embodiment, the first interval 541 is terminated simultaneously with the third interval 545.

As illustrated, the dynamic node signal 511 initially has a high state, indicating that the system is in a precharge phase. The system then shifts to an evaluation phase when the clock signal 501 is high, and the evaluation phase lasts for the period when the clock signal 501 is high, between transition 509 and transition 521. In response to the change in the clock signal 501, the latch output signal 520 and the output signal 513 change states at 512 and at 513, and the system is prepared to receive and transfer information. During the evaluation phase, the dynamic node signal 511 changes states at 515 in response to the change in output from a dynamic module. According to this particular embodiment, this change initiates a first interval 541. After the dynamic node signal 511 changes at 515, the latch receives the charge (data) from the dynamic node signal 511 and the latch output signal 520 changes to a low state at 517, and holds this state. Additionally, the output signal 523 changes to a high state at 519 due to the change in the dynamic node signal 511. When the latch output signal 520 changes states at 517, this represents initiation of a second interval 543 and a third interval 545. As illustrated, the second interval 543 and the third interval 545 are initiated during the first interval 541.

As further illustrated in FIG. 5, the system returns to a precharge phase from the evaluation phase as the clock signal 501 changes states at 521. This change from the evaluation phase to the precharge phase, subsequently causes the dynamic node signal 511 to return to a high state at 524. In this particular embodiment, the change of state of the dynamic node signal 511 at 514 represents the end of the first interval 541 and the end of the third interval 545.

The system returns to an evaluation phase when the clock signal 501 changes to a high state at 525. Accordingly, the return of the system to an evaluation phase causes the latch output signal 520 and output signal 523 to change states at 527 and 529 respectively, and ready the system to receive and transfer information. As such, when the latch output signal 520 returns to a high state at 527, the second interval 543 ends, as the latch output signal 520 has changed states.

In reference to the embodiments provided herein, a device and method for incorporating a parallel latching module is provided. Particularly, a device and method are provided which include a combination of features, representing a departure from conventional techniques. Notably, the device and techniques provided herein include utilization of latches, logic devices, integrated logic modules and dynamic devices in a parallel latching architecture along a critical pathway to reduce undesirable delays in the transfer of information. While some embodiments herein disclose particular features and arrangements of the parallel latching device, using the guidelines provided herein, those skilled in the art can implement the parallel latching system and techniques in other contexts without departing from the scope of the present disclosure. Moreover, it shall be appreciated that all circuitry described herein may be implemented either in silicon or another semiconductor material or alternatively by software code representation of silicon or another semiconductor material.

Other embodiments, uses, and advantages of the disclosure will be apparent to those skilled in the art from consideration of the specification and practice of the disclosure disclosed herein. As used herein, the term "charge" includes not only those values including positive and negative charges, but also charges having no charge value or effectively a zero charge value. Also, as will be appreciated, reference to a "charge" or "charge value" is reference to data or information, generally being transferred between devices, typically semiconducting devices, that distinguish signals or currents having a particular charge as distinct information or data. It will further be appreciated that, although some circuit elements are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A device comprising:
    a dynamic module comprising a data output, a memory array comprising a plurality of inputs, a memory output coupled to the data output, and a sense amplifier coupled between the memory array and the memory output;
    a logic gate comprising a first input coupled to the data output, a second input, and an output; and
    a latch comprising a first input coupled to the data output, and a first output coupled to the second input of the logic gate.

2. The device of claim 1, wherein the latch is a static latch.

3. The device of claim 1, wherein the latch is a dynamic latch.

4. The device of claim 1, wherein the device further comprises a logic module coupled between the data output and the input of the latch.

5. The device of claim 1, wherein the latch further comprises an integrated logic module.

6. The device of claim 5, wherein the integrated logic module comprises a multiplexer.

7. The device of claim 5, wherein the integrated logic module comprises a bypass module.

8. The device of claim 5, wherein the integrated logic module comprises a scan module.

9. The device of claim 1, wherein the logic gate is a NAND gate.

10. A device comprising:
    an adder module comprising a data output;
    a logic gate comprising a first input coupled to the data output, a second input, and an output; and
    a latch comprising a first input coupled to the data output, and a first output coupled to the second input of the logic gate.

11. The device of claim 10, wherein the latch is a static latch.

12. The device of claim 10, wherein the latch is a dynamic latch.

13. The device of claim 10, wherein the device further comprises a logic module coupled between the data output and the input of the latch.

14. The device of claim 10, wherein the latch further comprises an integrated logic module.

15. The device of claim 10, wherein the integrated logic module comprises a multiplexer.

16. The device of claim 5, wherein the integrated logic module comprises a bypass module.

17. The device of claim 5, wherein the integrated logic module comprises a scan module.

18. A device comprising:
- a comparator module comprising a data output;
- a logic gate comprising a first input coupled to the data output, a second input, and an output; and
- a latch comprising a first input coupled to the data output, and a first output coupled to the second input of the logic gate.

19. The device of claim 10, wherein the latch is a static latch.

20. The device of claim 10, wherein the latch is a dynamic latch.

* * * * *

UNITED STATES PATENT AND TRADEMARK OFFICE
CERTIFICATE OF CORRECTION

| | | |
|---|---|---|
| PATENT NO. | : 7,499,342 B2 | Page 1 of 1 |
| APPLICATION NO. | : 11/620080 | |
| DATED | : March 3, 2009 | |
| INVENTOR(S) | : Maciej Bajkowski et al. | |

It is certified that error appears in the above-identified patent and that said Letters Patent is hereby corrected as shown below:

Column 2, Line 22, please change "memory airy 711" to --memory array 711--

Signed and Sealed this
Eighteenth Day of January, 2011

David J. Kappos
*Director of the United States Patent and Trademark Office*